United States Patent
Senga et al.

(10) Patent No.: US 7,203,564 B2
(45) Date of Patent: Apr. 10, 2007

(54) TREATMENT CONDITION DECISION METHOD, TREATMENT CONDITION DECISION SYSTEM, TREATMENT SYSTEM, TREATMENT CONDITION DECISION CALCULATOR PROGRAM, PROGRAM RECORDING MEDIUM, AND SEMICONDUCTOR DEVICE MANUFACTURING METHOD

(75) Inventors: Tatsuya Senga, Kawasaki (JP); Yoshijiro Ushio, Yokohama (JP)

(73) Assignee: Nikon Corporation, Tokyo (JP)

( * ) Notice: Subject to any disclaimer, the term of this patent is extended or adjusted under 35 U.S.C. 154(b) by 288 days.

(21) Appl. No.: 10/924,201

(22) Filed: Aug. 24, 2004

(65) Prior Publication Data
US 2005/0176348 A1 Aug. 11, 2005

Related U.S. Application Data

(63) Continuation of application No. PCT/JP03/03304, filed on Mar. 19, 2003.

(30) Foreign Application Priority Data
Mar. 20, 2002 (JP) ............................. 2002-078726

(51) Int. Cl.
*G06F 19/00* (2006.01)
(52) U.S. Cl. ...................... 700/121; 438/692
(58) Field of Classification Search .................. 700/97, 700/121, 175, 183
See application file for complete search history.

(56) References Cited

U.S. PATENT DOCUMENTS

| | | | | |
|---|---|---|---|---|
| 4,731,855 A * | 3/1988 | Suda et al. | ................. | 382/149 |
| 5,599,423 A | 2/1997 | Parker et al. | ............... | 438/692 |
| 6,458,312 B1 * | 10/2002 | Sumi et al. | ................. | 264/512 |
| 7,114,144 B2 * | 9/2006 | Tokunaga et al. | ............. | 716/21 |
| 2004/0053558 A1 | 3/2004 | Senga et al. | .................... | 451/5 |
| 2004/0218806 A1* | 11/2004 | Miyamoto et al. | .......... | 382/145 |

FOREIGN PATENT DOCUMENTS

| | | |
|---|---|---|
| EP | 1 092 505 A2 | 4/2001 |
| JP | 4-59126 A | 2/1992 |

* cited by examiner

*Primary Examiner*—Albert W. Paladini
*Assistant Examiner*—Chad Rapp
(74) *Attorney, Agent, or Firm*—Morgan, Lewis & Bockius, LLP (57) ABSTRACT

In step S11, quantities that are varied (parameters) are respectively varied in a stepwise manner at a specified pitch, and standard working conditions consisting of combinations of these parameters are determined. For all of the standard working conditions, a working is actually performed, and the treated shapes that are obtained as a result are taken as the standard treated shapes for the respective standard working conditions (step S12). In cases where an appropriate simulation program is available, the standard treated shapes may be determined by simulation without actually performing a working. The standard working conditions and standard treated shapes thus determined are stored in a memory device. When the desired shape that is to be obtained by working is given in step S13, a standard treated shape that is close to the desired shape is sought in step S14. Thus, when a treated shape is given, the working conditions for this treated shape can be determined.

21 Claims, 8 Drawing Sheets

TREATMENT CONDITION DECISION METHOD, TREATMENT CONDITION DECISION SYSTEM, TREATMENT SYSTEM, TREATMENT CONDITION DECISION CALCULATOR PROGRAM, PROGRAM RECORDING MEDIUM, AND SEMICONDUCTOR DEVICE MANUFACTURING METHOD

This is a continuation of PCT International Application No. PCT/JP03/03304 filed on Mar. 19, 2003, which is hereby incorporated by reference

TECHNICAL FIELD

The present invention relates to a working condition decision method which decides working conditions corresponding to a treated shape when such a treated shape is given in a working such as grinding or polishing, a working condition decision system for the same purpose, a working system, a working condition decision calculator program, a program recording medium that stores this program, and a semiconductor device manufacturing method using this working condition decision system or working system. Furthermore, the term "working" found in the present specification and claims refers to a mechanical working such as polishing or grinding.

BACKGROUND ART

As semiconductor integrated circuits have become finer and more highly integrated, the steps of semiconductor manufacturing processes have increased in number and become more complicated. As a result, the surfaces of semiconductor devices are no longer always flat. The presence of steps on the surfaces of semiconductor devices leads to step interruptions of wiring and local increases in resistance, etc., and may thus cause disconnections and drops in the electrical capacity. Furthermore, in insulating films, such steps lead to a deterioration in the withstand voltage and leakage.

Meanwhile, as semiconductor integrated circuits have become finer and more highly integrated, the wavelengths of the light sources of semiconductor exposure apparatuses used in photolithography have become shorter, and the numerical aperture values or so-called NA values of the projection lenses of such semiconductor exposure apparatuses have become larger. As a result, the focal depths of the projection lenses of such semiconductor exposure apparatuses have become substantially shallower. In order to handle such increasing shallowness of the focal depth, flattening of the surfaces of semiconductor devices is required to a greater degree than in the past.

Figure 7:
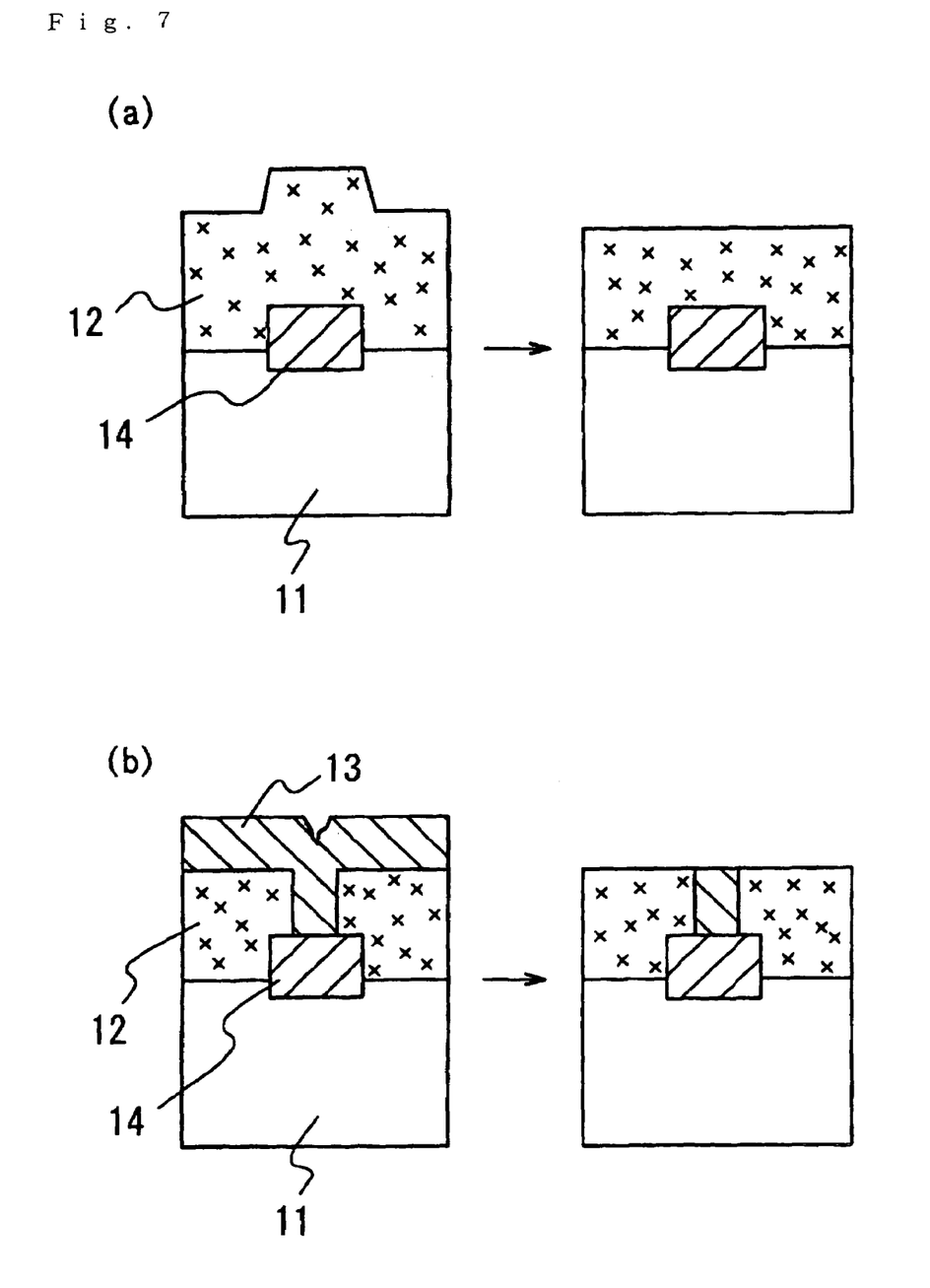
FIG. 7 is a diagram which shows an example of a flattening technique in a semiconductor process.

To give a concrete example, a flattening technique such as that shown in FIG. 7 has become essential in semiconductor processes. Here, a semiconductor device 14, an inter-layer insulating film 12 consisting of $SiO_2$ and a metal film 13 consisting of Al are formed on the surface of a wafer 11. FIG. 7(a) shows an example of the flattening of the inter-layer insulating film 12 on the surface of the semiconductor device. FIG. 7(b) shows an example of the formation of a so-called damascene by the polishing of the metal film 13 on the surface of the semiconductor device.

A chemical mechanical polishing or chemical mechanical planarization (hereafter referred to as "CMP") technique is widely used as a method for flattening the surface of such a semiconductor device. Currently, this CMP technique is the only method that can flatten the entire surface of a wafer.

Figure 8:
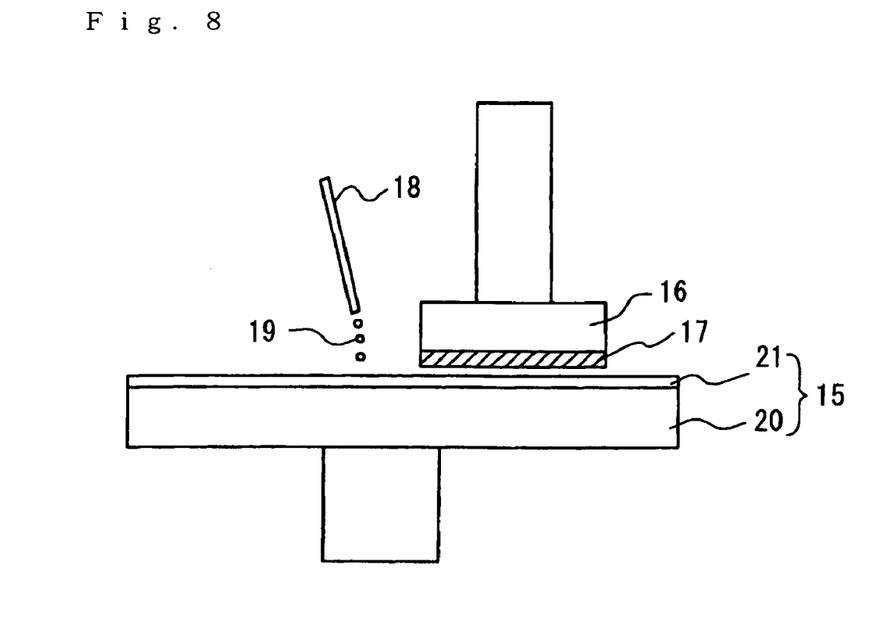
FIG. 8 is a schematic structural diagram of a polishing (flattening) apparatus used in CMP.

CMP has been developed on the basis of wafer mirror surface polishing methods. FIG. 8 is a schematic structural diagram of the polishing (flattening) apparatus used in CMP. The polishing apparatus is constructed from a polishing member 15, a polishing object holding part (hereafter also referred to as a "polishing head") 16 and a polishing agent supply part 18. Furthermore, a wafer 17 that constitutes the object of polishing is attached to the polishing head 16, and the polishing agent supply part 18 supplies a polishing agent (slurry) 19. The polishing member 15 is a member in which a polishing body (hereafter also referred to as a "polishing pad") 21 is bonded to the surface of a platen 20.

The wafer 17 is held by the polishing head 16, and is caused to swing while being rotated; furthermore, this wafer 17 is pressed against the polishing body 21 of the polishing member 15 with a specified pressure. The polishing member 15 is also caused to rotate, and is thus caused to perform a relative motion with respect to the wafer 17. In this state, the polishing agent 19 is supplied to the surface of the polishing body 21 from the polishing agent supply part 18; the polishing agent 19 diffuses over the surface of the polishing body 21, and enters the space between the polishing body 21 and the wafer 17 as relative motion takes place between the polishing member 15 and wafer 17, so that the surface of the wafer 17 that is to be polished is polished. Specifically, mechanical polishing by the relative motion of the polishing member 15 and wafer 17 and the chemical action of the polishing agent 19 act in a synergistic manner, so that favorable polishing is performed.

Figure 9:
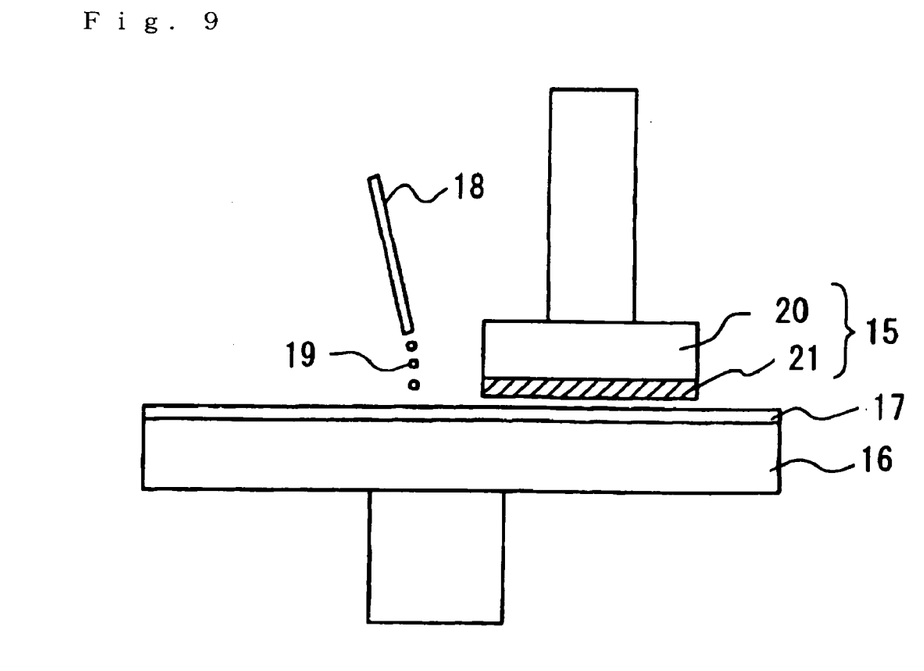
FIG. 9 is a schematic structural diagram of another polishing (flattening) apparatus used in CMP.

FIG. 9 is a schematic diagram which shows another polishing apparatus. In this polishing apparatus, the polishing head 16 is on the lower side, and the wafer 17 is chucked above this polishing head 16. Furthermore, the polishing body 21 has a smaller diameter than the wafer 17, and is bonded to a polishing platen 20 that is disposed above. Specifically, the polishing body 21 is caused to swing while being rotated together with the polishing platen 20, and is pressed against the wafer 17 with a specified pressure. The polishing head 16 and wafer 17 are also caused to rotate, and are thus caused to perform a relative motion with respect to the polishing body 21. In this state, a polishing agent 19 is supplied to the surface of the wafer 17 from the polishing agent supply part 18; the polishing agent 19 diffuses over the surface of the wafer 17 and enters the space between the polishing body 21 and the wafer 17 as relative rotation occurs between the polishing member 15 and the wafer 17, so that the surface of the wafer 17 that is to be polished is polished.

However, the number of types of wafers that require polishing is extremely large, and independent polishing conditions (recipes) that are suited to these respective types of wafers must be set.

For example, in the case of polishing that extends over a plurality of layer structures such as Cu damascene, Cu is ordinarily polished in a primary polishing process, and Ta is polished in a secondary polishing process. In this case, the uniformity varies greatly even under the same polishing conditions, as a result of differences in the polishing agent and object of polishing.

Accordingly, this method is troublesome in that polishing conditions must be separately prepared for each polishing operation. Furthermore, in the case of metal polishing, an oxidizing agent such as hydrogen peroxide must be added in addition to the polishing agent. Since the polishing profile varies according to the amount of this additive even in the case of the same polishing agent, the polishing conditions must be varied for all cases when the type of polishing agent, additive and object of polishing vary.

Polishing conditions include the type of polishing liquid, the type of polishing pad, the rotational speed of the polishing head and polishing member, the swinging speed of the polishing head, and the pressing pressure of the polishing head, etc. The rotational speed of the polishing head and polishing member, the swinging speed of the polishing head and the pressing pressure of the polishing head are functions of time or functions of polishing head position.

Conventionally, as the method used to set the polishing conditions in accordance with the type of wafer involved, a method has been employed in which test polishing is performed by trial and error on the basis of experience, and polishing conditions that produce the desired treated shape are found. In this case, numerous wafers are used in this test polishing, and considerable time is spent in determining the polishing conditions.

Furthermore, even assuming that the type of wafer used can be specified, and that standard polishing conditions can be found, the pre-polishing surface shape of the wafer that is actually polished varies according to the manufacturing lot. Therefore, for each manufacturing lot, fine adjustment of the polishing conditions must be performed by performing further test polishing. However, even if fine adjustment for each manufacturing lot is thus performed, a problem remains: namely, variation within manufacturing lots cannot be handled.

In conventional polishing apparatuses, in which the polishing body is larger than the wafer that is being polished, the following problem arises: namely, the size of the apparatus itself is increased as the diameter of the wafer increases. Furthermore, the following drawback is also encountered: specifically, the replacement work of consumable parts that require replacement such as the polishing pad is extremely difficult as a result of this large size. Moreover, in cases where there are indentations or projections arising from irregularities in the film on the surface of the wafer prior to polishing, it is extremely difficult to polish the wafer to a flat surface by appropriately dealing with these indentations and projections. Furthermore, in the case of wafers in which the initial film thickness and shape constitute an M type or W type, etc., according to the film formation process, there may be instances in which it is necessary to polish the remaining film to a uniform shape. It is difficult to meet such requirements in the case of a conventional polishing apparatus.

Recently, polishing apparatuses using a polishing body that is smaller than the wafer that is being polished (as shown in FIG. 9) have been developed and used as polishing apparatuses that solve these problems. Since such polishing apparatuses have a small polishing body, these apparatuses are advantageous in that the size of the polishing part in the polishing apparatus can be reduced. Furthermore, with regard to the replacement of consumable parts as well, such replacement work is extremely easy because of the small size of the parts.

Furthermore, in such polishing apparatuses using a polishing body that is smaller than the wafer that is being polished, the polishing profile can be freely varied by varying the probability of the presence of the polishing body on respective parts of the wafer. Accordingly, it is possible to handle cases in which there are indentations and projections in the surface of the wafer prior to polishing.

However, the fact that such fine adjustment is possible means that the polishing conditions must be determined with greater precision. Specifically, the types of polishing conditions increase in number and become more complicated, and there is an increase in the number of times that polishing conditions must be determined; furthermore, there is an increase in the quantity of time and wafers required in order to determine a single polishing condition. Moreover, even in cases where fine adjustment is not required, since the polishing body is small, the fact that the polishing conditions are complicated compared to those of a polishing apparatus using a conventional large polishing body remains unchanged.

Specifically, in the case of polishing using a small-diameter pad, it is necessary to apply variable-speed swinging (besides rotation) in order to vary the probability of the pad being present on the wafer surface, and to perform load control that reduces the load in order to suppress a rise in the polishing speed at the edges of the wafer. Accordingly, as a result of the addition of these control actions, the polishing conditions are greatly increased in complexity.

Thus, a method in which the polishing conditions are determined by simulation has been developed as one means of solving the problem of a considerable time being required for the determination of the polishing conditions. However, in the polishing process, the polishing body undergoes elastic deformation; furthermore, the flow of the polishing agent between the polishing body and the object of polishing is complicated, and frictional heat is generated during polishing. Accordingly, the expression of the overall polishing process in terms of numerical formulae is difficult, and an all-purpose numerical model has not yet been obtained.

DISCLOSURE OF THE INVENTION

The present invention was devised in light of such facts; the object of the present invention is to provide a working condition decision method for deciding working conditions corresponding to a treated shape when such a treated shape is given in a working such as polishing, a working condition decision system for the same purpose, a working system, a working condition decision calculator program, a recording medium for recording this calculator program, and a semiconductor device manufacturing method using this working condition decision system or working system.

The first invention that is used to achieve the object described above is a method for deciding the working conditions under which an object of working is treated to a specified treated shape, this working condition decision method being characterized in that a plurality of working conditions (standard working conditions) are set, a treated shape (standard treated shape) obtained using these standard working conditions is decided for each of the standard working conditions, the standard treated shapes are classified as classification patterns for each similar pattern, and when the desired treated shape is given, the classification pattern resembling the desired treated shape is first selected, a standard treated shape that is close to the desired treated shape is selected from the standard treated shapes included in the selected classification pattern, and the standard working conditions corresponding to the selected standard treated shape are selected as the working conditions.

The second invention that is used to achieve the object described above is the first invention, which is further characterized in that when the classification pattern resembling the desired treated shape is selected, a plurality of classification patterns are selected.

The third invention that is used to achieve the object described above is a method for deciding the working conditions under which an object of working is treated to a specified treated shape, this working condition decision method being characterized in that a plurality of working conditions (standard working conditions) are set, a treated shape (standard treated shape) obtained using these standard working conditions is decided for each of the standard working conditions, the standard treated shapes are classified as classification patterns for each similar pattern, and when the desired treated shape is given, a classification pattern resembling the desired treated shape is first selected, a combination of standard treated shapes that produces a treated shape that is close to the desired treated shape is selected by combining standard treated shapes that are included in the selected classification pattern, and the combination of standard working conditions that corresponds to the selected combination of standard treated shapes is selected as the working conditions.

The fourth invention that is used to achieve the object described above is the third invention, which is further characterized in that when the classification pattern resembling the desired treated shape is selected, a plurality of classification patterns are selected, and a combination of standard treated shapes that produces a treated shape that is close to the desired treated shape is selected by combining standard treated shapes that are included in the selected plurality of classification patterns.

The fifth invention that is used to achieve the object described above is a method for deciding the working conditions under which an object of working is treated to a specified treated shape, this working condition decision method being characterized in that for all of the working conditions (standard working conditions) that are formed by combinations of all of the parameters obtained by varying the respective parameters constituting the working conditions in at least two stages, the treated shapes (standard treated shapes) obtained using these working conditions are determined, and when the desired treated shape is given, a standard treated shape that is close to the desired treated shape is selected from the predetermined standard treated shapes, and the standard working conditions corresponding to the selected standard treated shape are selected as the working conditions.

The working conditions that decide the treated shape generally include a plurality of parameters. As will be described later, in the case of CMP polishing, for example, the relative speed between the object of polishing and the polishing body, the polishing time, the polishing pressure, the polishing agent flow rate, the polishing agent correction coefficient, and the like are parameters. In the present invention, these respective parameters are varied in at least two stages, and the respective working conditions formed as a result are taken as the standard working conditions. For instance, if the number of parameters is M, and each parameter is varied in N stages, then NM standard working conditions are produced.

Then, the treated shapes (standard treated shapes) that are obtained when workings are performed using the respective standard working conditions are determined. With regard to the determination of the standard treated shapes, this decision may be made by actually performing workings and measuring the resulting treated shapes; alternatively, in cases where a simulation model can be used, this decision may be made by a simulation.

In cases where the shape that is actually to be obtained by working is given, the respective standard treated shapes and the shape that is to be obtained by working are compared, and a standard treated shape that is close to the shape that is to be obtained by working is selected. Then, the standard working conditions that correspond to this standard treated shape are determined as the working conditions.

An arbitrary publicly known method such as the method of least squares can be used as the method for selecting a standard treated shape that is close to the shape that is to be obtained by working. With regard to the judgment of a shape that is "close to the shape that is to be obtained by working," this can be judged by the dropping of the error below a specified value in the comparative method used, and the resulting standard treated shape can be used, or the standard treated shape that minimizes the error can be used.

The sixth invention that is used to achieve the object described above is a method for deciding the working conditions under which an object of working is treated to a specified treated shape, this working condition decision method being characterized in that for all of the working conditions (standard working conditions) that are formed by combinations of all of the parameters obtained by varying the respective parameters constituting the working conditions in at least two stages, the treated shapes (standard treated shapes) obtained using these working conditions are determined, and when the desired treated shape is given, a combination of standard treated shapes that produces a treated shape that is close to the desired treated shape is selected by combining standard treated shapes, and the combination of standard working conditions that corresponds to the selected combination of standard treated shapes is selected as the working conditions.

In the fifth invention described above, the selected working conditions are some working conditions among the standard working conditions. In cases where the number of working conditions used is small, this would appear to be sufficient. However, in cases where the number of working conditions used is large, in cases where new working conditions are set, or in cases where strict working precision is required, the standard working conditions do not always include the optimal working conditions.

In the present invention, in order to handle such situations, treated shapes that combine standard treated shapes (with weighting applied if necessary) are compared with the desired treated shape, and a combination of standard treated shapes that is close to the shape that is to be obtained by working is selected. Furthermore, the combination of standard working conditions that corresponds to these standard treated shapes is determined as the working conditions.

An arbitrary publicly known method such as the method of least squares can be used as the method for selecting a combination of standard treated shapes that is close to the shape that is to be obtained by working. With regard to the judgment of a shape that is "close to the shape that is to be obtained by working," this can be judged by the dropping of the error below a specified value in the comparative method used, and the resulting combination of standard treated shapes can be used, or the combination of standard treated shapes that minimizes the error can be used. In the present invention, shapes other than the standard treated shapes can be created by combining standard treated shapes; accordingly, compared to the fifth invention, working conditions that produce a shape that is closer to the desired treated shape can be determined.

The seventh invention that is used to achieve the object described above is the fifth or sixth invention which is characterized in that the standard treated shapes are classified for each similar pattern, and when the desired treated shape is given, the combination of classification patterns that gives this treated shape is first selected, and only the standard treated shapes that are included in the selected classification patterns are used as the objects of selection, or the combination of standard treated shapes that produces a treated shape that is close to the desired treated shape is used as the object of determination.

In the fifth and sixth inventions described above, in cases where the number of standard treated shapes is large, a considerable amount of time may be required in order to find appropriate shapes among these standard treated shapes (fifth invention), or a considerable amount of time may be required in order to find appropriate combinations of these standard treated shapes, and the number of standard treated shapes included in the determined combinations may become excessively large (sixth invention). In the present invention, the standard treated shapes are classified for each similar pattern. Then, when the desired treated shape is given, the combination of classification patterns that gives this treated shape is first selected. For example, assuming that the standard treated shapes are classified as A, B, C or D for each similar pattern, then the classification pattern of A is first selected with attention given to the similarity with the desired shape.

Furthermore, only the standard treated shapes in the selected classification pattern (A in this example) are used as the objects of selection; alternatively, a combination of standard treated shapes that produces a treated shape that is close to the desired treated shape is used as the object of determination. As a result, the number of standard treated shapes that constitute the objects of selection can be greatly reduced. Accordingly, combinations of treated shapes can be found in a short time; furthermore, the number of standard treated shapes that constitute the objects of combination can also be reduced in some cases.

The eighth invention that is used to achieve the object described above is any of the first through seventh inventions, which is further characterized in that the working is polishing in which an object of polishing is polished by causing relative motion between a polishing body and this object of polishing in a state in which a polishing agent is interposed between the polishing body and the object of polishing.

The ninth invention that is used to achieve the object described above the eighth invention, which is further characterized in that the working conditions include one or more of the following: rotational speed of the object of polishing, rotational speed of the polishing body, polishing time, polishing pressure, polishing agent flow rate, starting position of swinging of the polishing body, swinging stroke of the polishing body and polishing agent correction coefficient.

The tenth invention that is used to achieve the object described above is a working condition decision system for deciding the working conditions under which an object of working is treated to a specified treated shape, this working condition decision system being characterized in that the system has model memory means for classifying and storing as classification patterns (for each similar pattern) the treated shapes (standard treated shapes) obtained using the working conditions, for all of the working conditions (standard working conditions) that are formed by combinations of all of the parameters obtained by varying the respective parameters constituting the working conditions in at least two stages, means for inputting the desired treated shape, and working condition decision means for first selecting a classification pattern that resembles the desired treated shape from the standard treated shapes, then selecting a standard treated shape that is close to the desired treated shape from the standard treated shapes contained in the selected classification pattern, and selecting the standard working conditions corresponding to the selected standard treated shape as the working conditions.

The eleventh invention that is used to achieve the object described above is the tenth invention, which is further characterized in that when the classification pattern that gives the desired treated shape is selected, a plurality of classification patterns are selected.

The twelfth invention that is used to achieve the object described above is a working condition decision system for deciding the working conditions under which an object of working is treated to a specified treated shape, this working condition decision system being characterized in that the system has model memory means for classifying and storing as classification patterns (for each similar pattern) the treated shapes (standard treated shapes) obtained using the working conditions, for all of the working conditions (standard working conditions) that are formed by combinations of all of the parameters obtained by varying the respective parameters constituting the working conditions in at least two stages, means for inputting the desired treated shape, and working condition decision means for first selecting a classification pattern that resembles the desired treated shape from the combinations of standard treated shapes, then selecting a standard treated shape that is close to the desired treated shape from the standard treated shapes contained in the selected classification pattern, and selecting the combination of standard working conditions that corresponds to the selected combination of standard treated shapes as the working conditions.

The thirteenth invention that is used to achieve the object described above is the twelfth invention, which is further characterized in that when the classification pattern that resembles the desired treated shape is selected, a plurality of classification patterns are selected, and a combination of standard treated shapes that produces a treated shape that is close to the desired treated shape is selected by combining standard treated shapes contained in the selected plurality of classification patterns.

The fourteenth invention that is used to achieve the object described above is a working condition decision system for deciding the working conditions under which an object of working is treated to a specified treated shape, this working condition decision system being characterized in that the system has model memory means for storing the treated shapes (standard treated shapes) obtained using the working conditions, for all of the working conditions (standard working conditions) that are formed by combinations of all of the parameters obtained by varying the respective parameters constituting the working conditions in at least two stages, means for inputting the desired treated shape, and working condition decision means for selecting a standard treated shape that is close to the desired treated shape from the standard treated shapes, and selecting the standard working conditions corresponding to the selected standard treated shape as the working conditions.

The fifteenth invention that is used to achieve the object described above is a working condition decision system for deciding the working conditions under which an object of working is treated to a specified treated shape, this working condition decision system being characterized in that the system has model memory means for storing the treated shapes (standard treated shapes) obtained using the working conditions, for all of the working conditions (standard working conditions) that are formed by combinations of all of the parameters obtained by varying the respective parameters constituting the working conditions in at least two stages, means for inputting the desired treated shape, and working condition decision means for selecting a combination of standard treated shapes that is close to the desired treated shape form the combinations of standard treated shapes, and selecting the combination of standard working conditions that corresponds to the selected combination of standard treated shapes as the working conditions.

The sixteenth invention that is used to achieve the object described above is the fourteenth or fifteenth invention, which is further characterized in that the model memory means are devised so that these means classify and store the standard treated shapes for each similar pattern, and the working condition decision means have a function which is such that when the desired treated shape is given, the combination of classification patterns that produces this treated shape is first selected, and a selection is then performed with only the standard treated shapes contained in the selected classification patterns taken as objects of selection, or with the combination of standard treated shapes that produces a treated shape that is close to the desired treated shape taken as the object of selection.

The first through seventh inventions can be respectively executed using these tenth through sixteenth inventions. Furthermore, in these inventions, the system may be devised so that standard treated shapes for the standard working conditions are stored beforehand in the model memory means, or so that the standard treated shapes for the standard working conditions are written in afterward by the means for inputting the standard working conditions and means for inputting the standard treated shapes or means for calculating the standard treated shapes.

The seventeenth invention that is used to achieve the object described above is any of the tenth through sixteenth inventions, which is further characterized in that the working is polishing in which an object of polishing is polished by causing relative motion between a polishing body and this object of polishing in a state in which a polishing agent is interposed between the polishing body and the object of polishing.

The eighteenth invention that is used to achieve the object described above is the seventeenth invention, which is further characterized in that the working conditions include one or more of the following: rotational speed of the object of polishing, rotational speed of the polishing body, polishing time, polishing pressure, polishing agent flow rate, starting position of swinging of the polishing body, swinging stroke of the polishing body and polishing agent correction coefficient.

The nineteenth invention that is used to achieve the object described above is a working system using a working apparatus that treats an object of working by causing the relative motion of a tool and this object of working in a state in which abrasive particles are interposed between the tool and object of working, this working system being characterized in that the system has means for deciding the working conditions by the working condition decision method of any of the first through ninth inventions, or the working condition decision system of any of the tenth through eighteenth inventions, and means for controlling the working apparatus so as to conform to the decided working conditions.

Since the present invention has means for deciding the working conditions by the working condition decision method of any of the first through ninth inventions, or the working condition decision system of any of the tenth through eighteenth inventions, the operations and effects described in the descriptions of the first through eighteenth inventions are respectively obtained.

The twentieth invention that is used to achieve the object describe above is a working condition decision calculator program for deciding the working conditions under which an object of working is treated to a specified treated shape, this working condition decision calculator program being characterized in that the program has a processing process in which the treated shapes (standard treated shapes) obtained using the working conditions are classified and stored in memory as classification patterns (for each similar pattern) for all of the working conditions (standard working conditions) that are formed by combinations of all of the parameters obtained by varying the respective parameters constituting the working conditions in at least two stages, a classification pattern that resembles the input desired treated shape is first selected from these standard treated shapes, a standard treated shape that is close to the input treated shape is then selected from the standard treated shapes contained in the selected classification pattern, and the standard working conditions that correspond to the selected standard treated shape are selected as the working conditions.

The twenty-first invention that is used to achieve the object described above is the twentieth invention, which is further characterized in that when the classification pattern that resembles the desired treated shape is selected, a plurality of classification patterns are selected.

The twenty-second invention that is used to achieve the object described above is a working condition decision calculator program for deciding the working conditions under which an object of working is treated to a specified treated shape, this working condition decision calculator program being characterized in that the program has a processing process in which the treated shapes (standard treated shapes) obtained using the working conditions are classified and stored in memory as classification patterns (for each similar pattern) for all of the working conditions (standard working conditions) that are formed by combinations of all of the parameters obtained by varying the respective parameters constituting the working conditions in at least two stages, a classification pattern that resembles the input desired treated shape is first selected, a combination of standard treated shapes that is close to the input treated shape is selected from the standard treated shapes contained in the selected classification pattern, and the combination of standard working conditions that corresponds to the selected combination of standard treated shapes is selected as the working conditions.

The twenty-third invention that is used to achieve the object described above is the twenty-second invention, which is further characterized in that when the classification pattern that resembles the desired treated shape is selected, a combination of a plurality of classification patterns is selected, and a combination of standard treated shapes that produces a treated shape that is close to the desired treated shape is selected by combining standard treated shapes that are contained in the selected combination of a plurality of classification patterns.

The twenty-fourth invention that is used to achieve the object described above is a working condition decision calculator program for deciding the working conditions under which an object of working is treated to a specified treated shape, this working condition decision calculator program being characterized in that the program has a processing process in which the treated shapes (standard treated shapes) obtained using the working conditions are stored in memory for all of the working conditions (standard working conditions) that are formed by combinations of all of the parameters obtained by varying the respective parameters constituting the working conditions in at least two stages, a standard treated shape that is close to the input desired treated shape is selected from these standard treated shapes, and the standard working conditions that correspond to the selected standard treated shape are selected as the working conditions.

The twenty-fifth invention that is used to achieve the object described above is a working condition decision calculator program for deciding the working conditions under which an object of working is treated to a specified treated shape, this working condition decision calculator program being characterized in that the program has a processing process in which the treated shapes (standard treated shapes) obtained using the working conditions are stored in memory for all of the working conditions (standard working conditions) that are formed by combinations of all of the parameters obtained by varying the respective parameters constituting the working conditions in at least two stages, a combination of standard treated shapes that is close to the input desired treated shape is selected, and the combination of standard working conditions that corresponds to the selected combination of standard treated shapes is selected as the working conditions.

The twenty-sixth invention that is used to achieve the object described above is the twenty-fourth or twenty-fifth invention, which is further characterized in that the standard treated shapes for the standard working conditions are classified for each similar pattern of the standard treated shapes, and the processing process has a processing function which is such that when the desired treated shape is given, the combination of classification patterns that produces this treated shape is first selected, and a selection is then performed with only the standard treated shapes contained in the selected classification patterns taken as objects of selection, or with the combination of standard treated shapes that produces a treated shape that is close to the desired treated shape taken as the object of selection.

The first through seventh inventions can be respectively executed in a calculator by using these twentieth through twenty-sixth inventions.

The twenty-seventh invention that is used to achieve the object described above is a program recording medium that records at least one of the working condition decision calculator programs according to any of the twentieth through twenty-sixth inventions.

In the present invention, the respective programs can be stored, and can be executed by means of a calculator.

The twenty-eighth invention that is used to achieve the object described above is a semiconductor device manufacturing method which is characterized in that this method includes a step in which wafer polishing conditions are decided using the working condition decision system of the seventeenth or eighteenth invention, and the wafer is polished by means of these polishing conditions, or a step in which the wafer is polished using the working system of the nineteenth invention.

In the present invention, since appropriate polishing conditions can be found in a short time, semiconductor devices can be manufactured with a good throughput.

As was described above, these inventions make it possible to provide a working condition decision method for deciding the working conditions corresponding to the treated shape when the treated shape is given, a working condition decision system, a working system, a working condition decision calculator program, a recording medium that records this calculator program, and a semiconductor device manufacturing method using this working condition decision system or working system.

BEST MODE FOR CARRYING OUT THE INVENTION

A first example of a working condition decision method constituting a first working configuration of the present invention will be described below using CMP polishing as an example. The polishing apparatus used in polishing is similar to that shown in FIG. 9. In such a polishing apparatus, it is assumed that the shape of the wafer that is obtained by polishing is determined by the rotational speed of the polishing pad, the rotational speed of the wafer, the pressing pressure of the polishing pad, the polishing time, the starting position of swinging of the polishing pad, and the swinging stroke of the polishing pad in cases where the shapes and materials of the polishing pad and wafer, the material of the polishing agent and the amount of the polishing agent are fixed.

Figure 1:
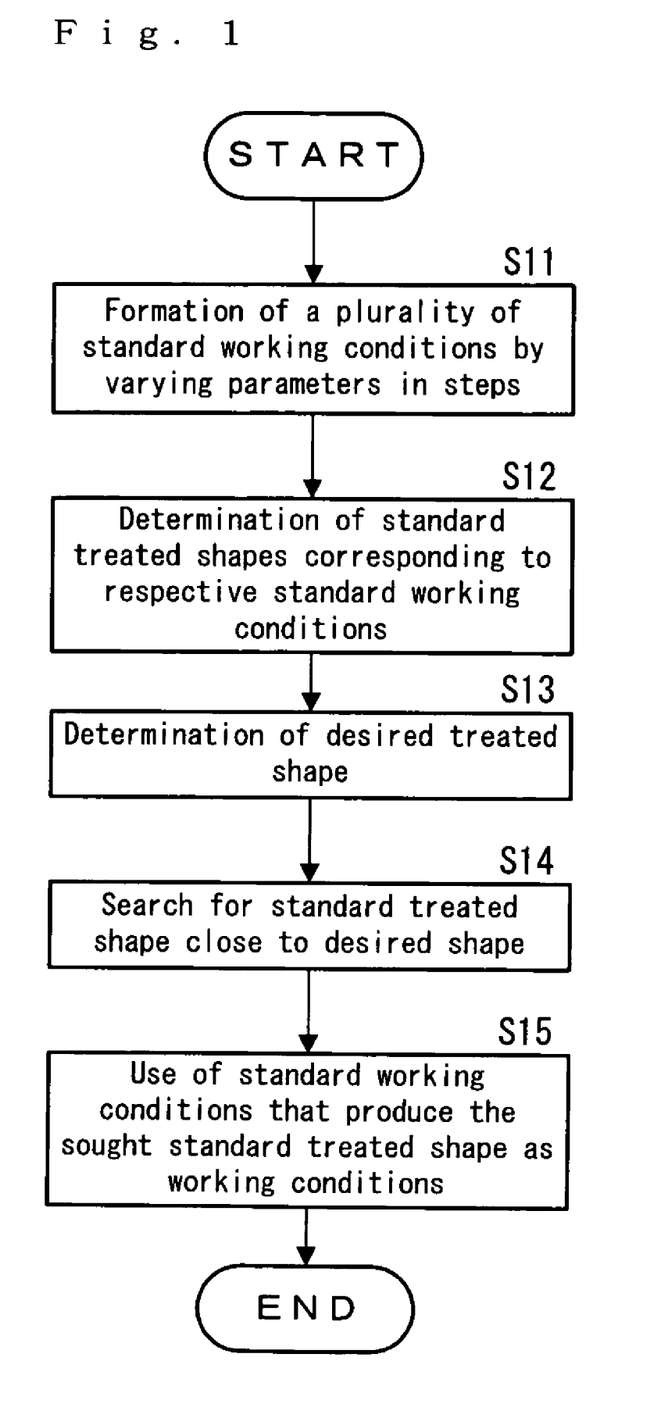
FIG. 1 is a flow chart which shows a first example of a working condition decision method constituting a working configuration of the present invention.

Accordingly, such a case is considered in the present working configuration, and processing is performed according to the flow shown in FIG. 1. First, in step S11, the rotational speed of the polishing pad, the rotational speed of the wafer, the pressing pressure of the polishing pad, the polishing time, the starting position of swinging of the polishing pad and the swinging stroke of the polishing pad, which are variable amounts (parameters), are respectively varied in a stepwise manner at a specified pitch, and standard working conditions consisting of combinations of these parameters are determined.

It would appear that the polishing of the wafer is performed in the same manner in locations that are separated from the center of the wafer by the same distance. Accordingly, the polished shape can be expressed as a linear function with the wafer radius as a variable. For each of the standard working conditions, a working is actually performed, and the treated shape that is obtained as a result is taken as the standard treated shape for this standard working condition (step S12). In cases where there is an appropriate simulation program, the standard treated shapes may also be determined by simulation without actually performing a working. The standard working conditions and standard treated shapes thus determined are stored in the memory device.

When the desired shape that is to be obtained by working is given in step S13, a standard treated shape that is close to the desired shape is sought in step S14. For example, this can be realized by the method of least squares or by a mutual correlation method. For instance, in a case where the shape that is to be obtained by working is expressed by f(x) (x is the position in the radial direction of the wafer), and the i-th standard treated shape is expressed by Gi(x), then i that minimizes $S_i$ determined by $$S_i = \int \{f(x) - G(x,i)\}^n dx \quad (1)$$

or i that places $S_i$ within a specified range is found, and the standard working conditions that give this standard treated shape are employed (step S15). Here, n is an even number of 2 or greater, and the integration range is the polishing region of the wafer. Furthermore, $$S_i = \int \{f(x) * G(x,i)\}^n dx \quad (2)$$

may also be used instead of Equation (1). The range of i may be all of the standard treated shapes; however, it would also be possible to select beforehand standard treated shapes that would appear to produce a shape that is close to the desired treated shape when combined, and to use only these standard treated shapes as the objects of selection. For example, in cases where the treated shape is a protruding shape, standard treated shapes with an indented shape can be excluded from the objects of selection. In this way, the calculation time can be shortened.

Figure 2:
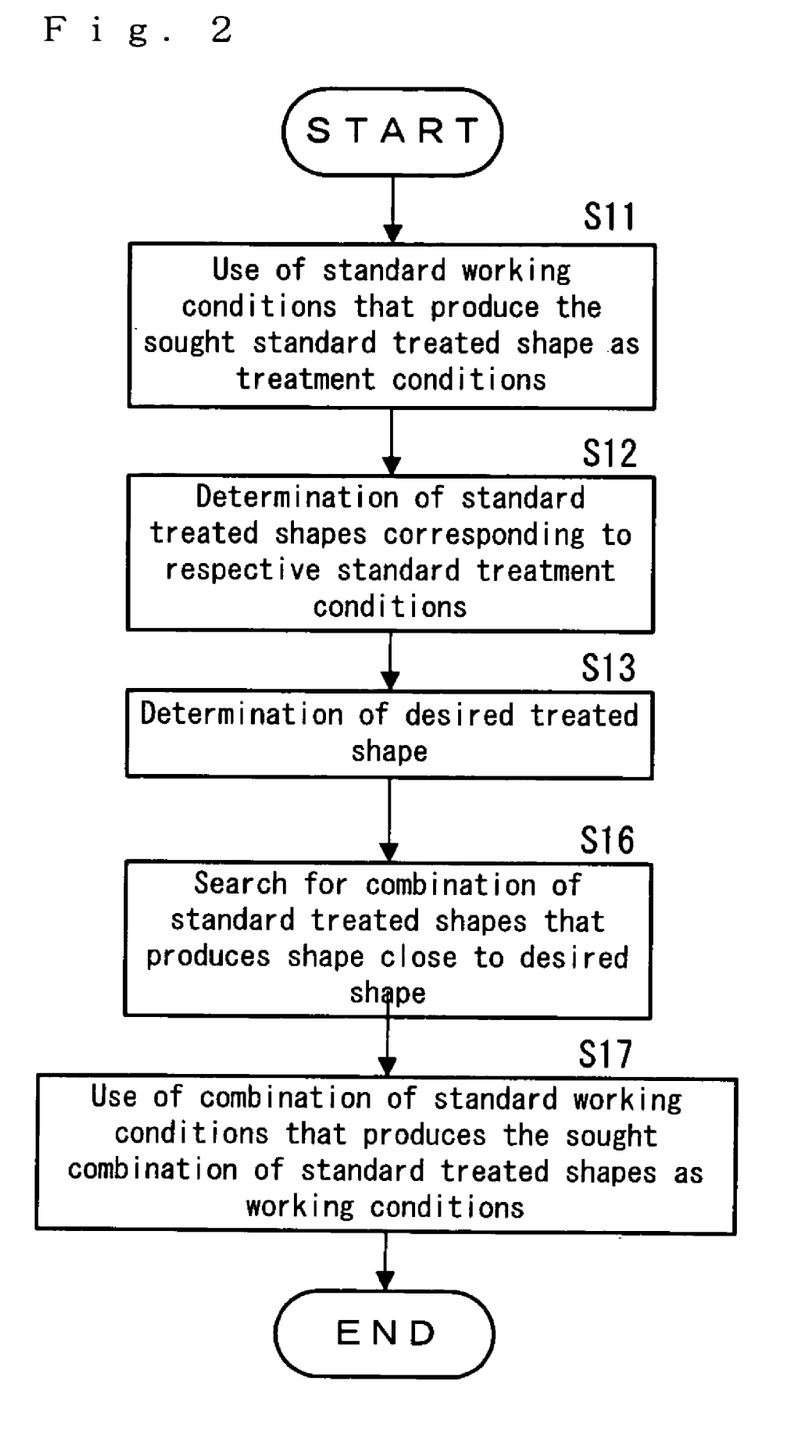
FIG. 2 is a flow chart which shows a second example of a working condition decision method constituting a working configuration of the present invention.

The flow of a second example of a working condition decision method constituting a second working configuration of the present invention is shown in FIG. 2. The working apparatus and working method are the same as in the first working configuration. The processing of this working configuration is the same as the processing of the first working configuration up to step S13. In the first working configuration, one of the standard working conditions was selected as an actual working condition; however, present working configuration is devised so that a weighted combination of standard working conditions is used as the actual working conditions.

Specifically, in step S16, a combination of standard treated shapes that produces a shape that is close to the desired shape is sought. The method of least squares is used as one example of this method. Specifically, with gi as a weighting coefficient, $g_i$ is determined by the method of least squares so that S' given by $$S' = \int \sum_i \{f(x) - g_i G(x, i)\}^2 dx \quad (3)$$

is minimized. Specifically, gi is determined by solving the simultaneous equation $$\frac{\partial S'}{\partial g_i} = 0 \quad (4)$$

either analytically or by numerical calculations. Here, the integration range is the polishing region of the wafer, and the range of i may be all of the standard treated shapes. However, it would also be possible to select beforehand standard treated shapes that would appear to produce a shape that is close to the desired treated shape when combined, and to use only these standard treated shapes as the objects of selection. If this is done, there is a possibility that the precision will deteriorate; however, a short calculation time is sufficient, and it becomes unnecessary to combine numerous working conditions in the actual working as well, so that there are many desirable aspects to this procedure.

When a combination of standard treated shapes producing a shape that is close to the desired shape is thus determined, the combination of standard working conditions that corresponds to this combination of standard treated shapes is determined as the final working conditions in step S17. In cases where the final working conditions are applied in the actual working (polishing), the application time of the respective selected standard working conditions is determined (for example) in accordance with the weighting coefficient, and the respective standard working conditions may be applied in order.

Thus, in cases where the final working conditions are determined as a combination of standard working conditions, time is required in order to select standard working conditions that can become candidates at some intermediate point in the process; furthermore, in the case of the second working configuration, if too many candidates are handled, the following problem arises: namely, time is required for both the calculations that determine the working conditions and the actual working. In order to solve these problems, similar treated shapes among the standard treated shapes are collected beforehand, and are classified according to similar patterns. Then, when the actual treated shape is determined, the similar pattern to which this shape belongs (the pattern to which this shape shows similarity) is first determined, and only standard treated shapes contained in the similar pattern are taken as search candidates; as a result, the required time can be greatly shortened. With regard to this method, concrete examples will be described in the embodiments.

Furthermore, when the actual treated shape is determined in the above working configuration, and the similar pattern to which this shape belongs (i.e., the pattern to which this shape shows a resemblance) is determined, two or more similar patterns may be selected; in this case, all of the standard treated shapes contained in the two or more selected similar patterns are taken as search candidates.

Figure 3:
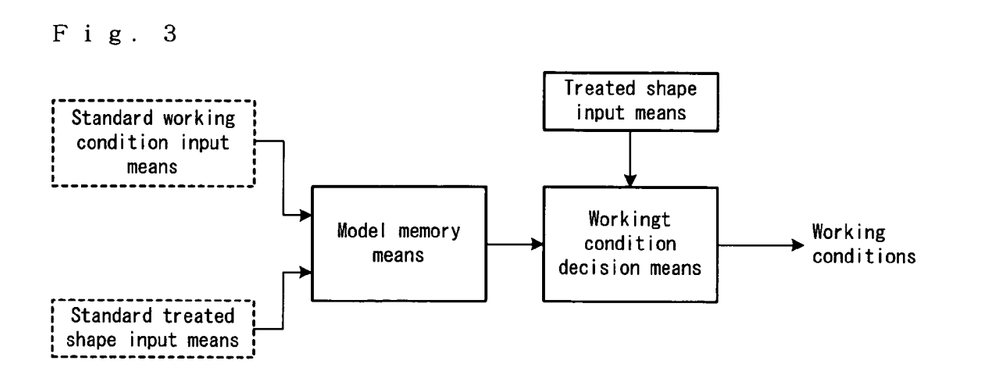
FIG. 3 is a block diagram which shows an example of a working condition decision system constituting a working configuration of the present invention.

An example of a working condition decision system constituting a third working configuration of the present invention is shown in FIG. 3. Here, predetermined standard working conditions and the standard treated shapes that are obtained as a result of performing a working using these standard working conditions (shapes obtained by simulation or shapes obtained by actual working) are respectively input by standard working condition input means and standard treated shape input means, and are stored in the model memory means. In some cases, such inputs may be completed by the manufacturer; therefore, it is conceivable that such standard working condition input means or standard treated shape input means are not needed.

When the shape that is actually to be produced by working is determined, and is input from the treated shape input means, the working condition decision means perform processing according to the flow described in the first working configuration or second working configuration, and thus decide and output the working conditions.

If an algorithm such as that described above is used, the working condition decision method of the present invention can be executed by a calculator. In this case, the working condition decision method can be described as a calculator program. If this program is stored in a calculator program memory medium, then the working conditions can be decided using a personal computer or the like. Accordingly, a human being using this program can give commands to the polishing apparatus, and can perform the target working. Furthermore, the working condition decision system shown in FIG. 3 is constructed by means of a calculator, and in this case, such a program can be stored in the program memory medium of this calculator.

Figure 4:
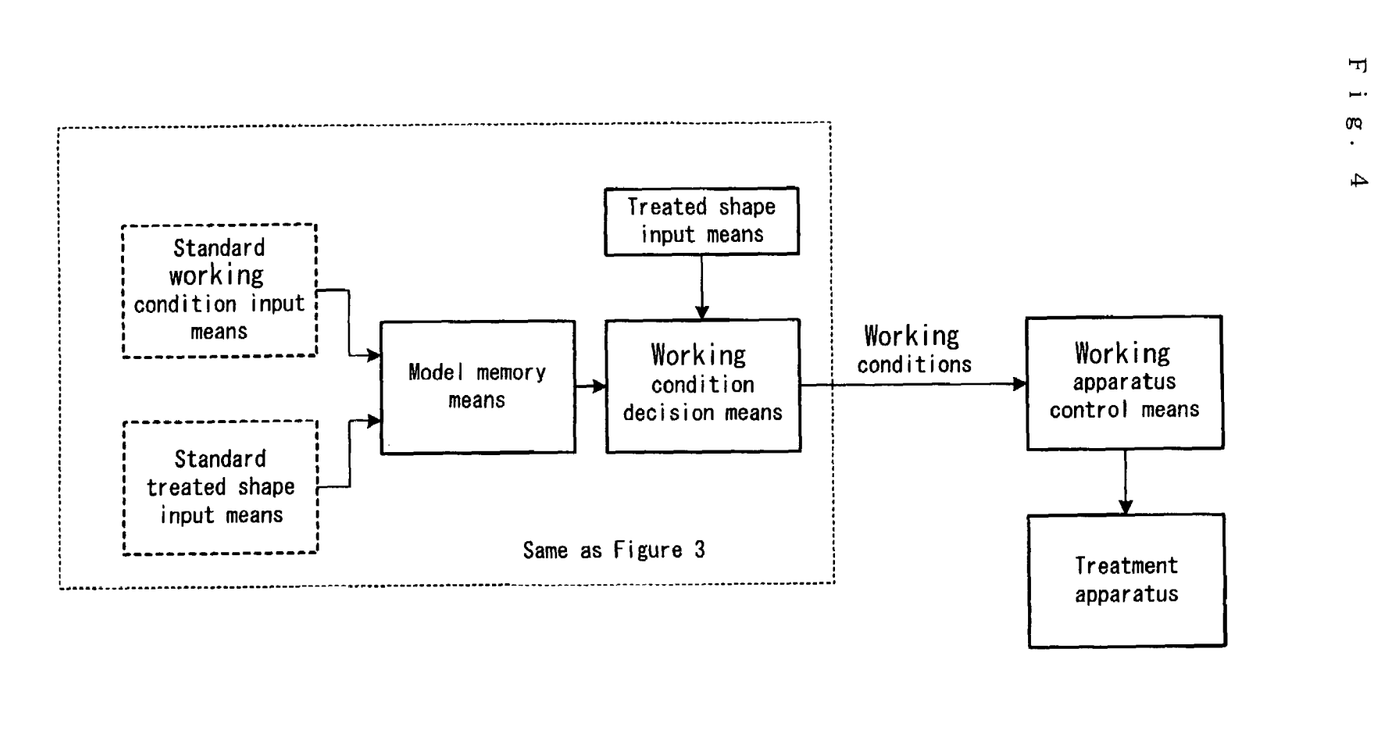
FIG. 4 is a block diagram which shows an example of a working system constituting a working configuration of the present invention.

Furthermore, as in the working system shown in FIG. 4, the working conditions that are output from the working condition decision means may be input directly into the working apparatus control means without human intervention, and the working apparatus control means may be devised so as to control the working apparatus in such a manner that these working conditions are realized. Furthermore, in FIG. 4, the parts other than the parts where the working conditions that are output from the working condition decision means are input into the working apparatus control means, and the working apparatus control means control the working apparatus, are the same as in FIG. 3.

Figure 5:
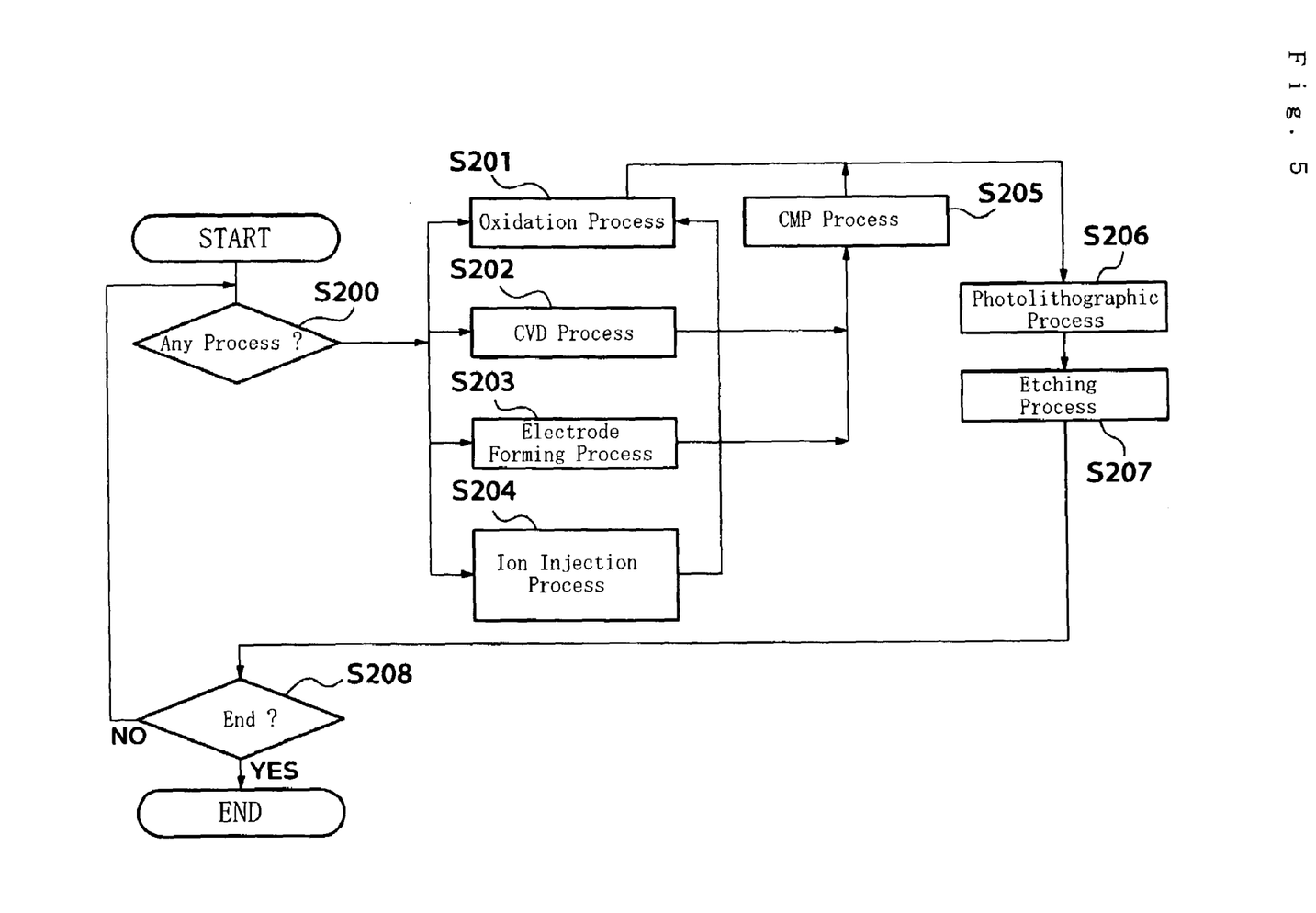
FIG. 5 is a diagram which shows a semiconductor device manufacturing method constituting a working configuration of the present invention.

A semiconductor device manufacturing method using the working system of the present invention will be described below. FIG. 5 is a flow chart which shows the semiconductor device manufacturing process. The semiconductor device manufacturing process is started, and in step S200, the appropriate working step is first selected from the steps S201 through S204 described below. The processing proceeds to one of the steps S201 through S204 in accordance with this selection.

Step S201 is an oxidation process in which the surface of the wafer is oxidized. Step S202 is a CVD process in which an insulating film is formed on the wafer surface by CVD, etc. Step S203 is an electrode formation process in which electrodes are formed on the wafer by a process such as vacuum deposition. Step S204 is an ion injection process in which ions are injected into the wafer.

Following the CVD process or electrode formation process, the processing proceeds to step S205. Step S205 is a CMP process. In the CMP process, planarization of the inter-layer insulating films, or the formation of a damascene by the polishing of a metal film on the surface of the semiconductor device, etc., is performed using the working system of the present invention.

Following the CMP process or oxidation process, the processing proceeds to step S206. Step S206 is a photolithographic process. In the photolithographic process, coating of the wafer with a resist, the baking of circuit patterns onto the wafer by exposure using an exposure apparatus, and the development of the exposed wafer, are performed. Furthermore, the next step S207 is an etching process in which portions other than the developed resist image are removed by etching, after which the resist is stripped, and the resist that has become unnecessary as a result of the completion of etching is removed.

Next, in step S208, a judgment is made as to whether or not all of the required processes have been completed. If these processes have not been completed, the processing returns to step S200, and the subsequent steps are repeated, so that a circuit pattern is formed on the wafer. If it is judged in step S208 that all of the processes have been completed, the processing is ended.

<Embodiment 1>

Polishing was performed using the polishing apparatus shown in FIG. 9, in which the polishing pad was a small-diameter pad that was smaller than the wafer. A 200 mm $\phi$ wafer with a thermal oxidation film was polished using the polishing pad that was a doughnut-shaped pad and that has an external diameter of 170 mm and an internal diameter of 60 mm.

With regard to the standard working conditions, conditions consisting of combinations of the parameters shown in Table 1 that were varied at the pitch shown in Table 1 in the ranges shown in Table 1 were used.

TABLE 1

| Parameter | Range | Increment (pitch) |
|---|---|---|
| Polishing pad rpm | −400 to 400 rpm | 100 rpm |
| Water rpm | 100 to 200 rpm | 100 rpm |
| Polishing pad pressing pressure | 100 to 400 g/cm$^2$ | 100 g |
| Polishing time | 20 to 100 sec | 20 sec |
| Starting position of swinging of polishing pad | 25 to 65 mm | 5 mm |
| Stroke of polishing pad | 10 to 50 mm | 10 mm |

The total number of standard working conditions was 16,200. The standard treated shapes corresponding to the respective standard working conditions were determined by simulation. Thus, a data base of standard working conditions and standard treated shapes was created, the treated shape was determined, the standard treated shape that was closest to the treated shape was selected from the total of 16,200 data by the method of least squares shown in the first working configuration, and the corresponding standard working conditions were used as the working conditions. The time required for the selection of the working conditions was 2 minutes.

<Embodiment 2>

Figure 6:
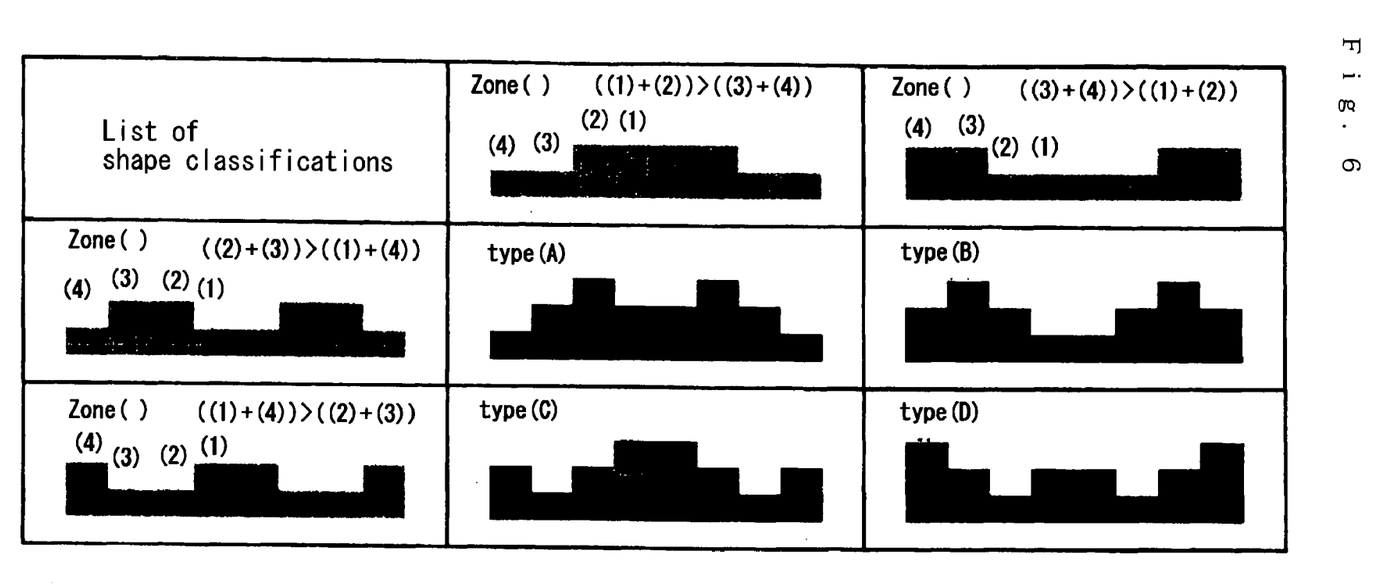
FIG. 6 is a diagram which shows typical shapes into which the standard treated shapes are classified in an embodiment of the present invention.

The 16,200 standard treated shapes calculated in Embodiment 1 were classified into four types ranging from type (A) to type (D) in accordance with the classification table shown in FIG. 6. The shapes shown in FIG. 6 are classified into four types by means of combinations of two types of indentation or projection of the wafer center and two types of the overall shape (as M shape or W shape).

In this judgment of shape, the area extending from the wafer center to the wafer edge was divided into four zones, and a classification was made with reference to the magnitude relationship of the amount of polishing.

| Type (A) | (zone 1 + zone 2) > (zone 3 + zone 4) |
| | (zone 1 + zone 4) < (zone 2 + zone 3) |
| | (projecting shape and M type shape) |
| Type (B) | (zone 1 + zone 2) < (zone 3 + zone 4) |
| | (zone 1 + zone 4) > (zone 2 + zone 3) |
| | (projecting shape and M type shape) |
| Type (C) | (zone 1 + zone 2) > (zone 3 + zone 4) |
| | (zone 1 + zone 4) > (zone 2 + zone 3) |
| | (indented shape and W type shape) |
| Type (D) | (zone 1 + zone 2) < (zone 3 + zone 4) |
| | (zone 1 + zone 4) > (zone 2 + zone 3) |
| | (indented shape and W type shape) |

Among the 16,200 shapes mentioned above, type (A) accounted for 5.3%, type (B) accounted for 11.6%, type (C) accounted for 21.1%, and type (D) accounted for 52.0%.

Since the desired treated shape was classified as type (A), a standard treated shape that was close to the desired treated shape was sought from the standard treated shapes belonging to type (A) in the same manner as in Embodiment 1. The time required for this search was 15 sec.

In this case, when the desired treated shape is given, the type as which the shape is classified can be determined by fitting the desired treated shape in decision logic for type (A) through type (D), and classifying the shape as the type that fits.

<Comparative Example>

After the desired treated shape was determined, 16,200 polished shapes were calculated in the same manner as in Embodiment 1 using a simulation program, and the treated shape that was closest to the desired shape was sought from these polished shapes in the same manner as in Embodiment 1. The time required for the calculation of the 16,200 polished shapes and the derivation of the optimal conditions was 2 hours.

INDUSTRIAL APPLICABILITY

In the present invention, the invention of the working condition decision method and the invention of the working condition decision system can be used to decide the working conditions of a mechanical working. Furthermore, the calculator program and program memory medium can be used to cause these inventions to be executed by a calculator. The semiconductor device manufacturing method can be used to manufacture semiconductor devices.

The invention claimed is:

1. A method for deciding the working conditions under which an object of working is treated to a specified treated shape, this working condition decision method being characterized in that a plurality of working conditions (standard working conditions) are set, a treated shape (standard treated shape) obtained using these standard working conditions is decided for each of the standard working conditions, the standard treated shapes are classified as classification patterns for each similar pattern, and when the desired treated shape is given, the classification pattern resembling the desired treated shape is first selected, a standard treated shape that is close to the desired treated shape is selected from the standard treated shapes included in the selected classification pattern, and the standard working conditions corresponding to the selected standard treated shape are applied as the working conditions for treating the object of working.

2. The working condition decision method according to claim 1, which is characterized in that when the classification pattern resembling the desired treated shape is selected, a plurality of classification patterns are selected.

3. The working condition decision method according to any one of claims 1 through 2, which is characterized in that the working is polishing in which an object of polishing is polished by causing relative motion between a polishing body and this object of polishing in a state in which a polishing agent is interposed between the polishing body and the object of polishing.

4. The working condition decision method according to claim 3, which is characterized in that the working conditions include one or more of the following:

rotational speed of the object of polishing, rotational speed of the polishing body, polishing time, polishing pressure, polishing agent flow rate, starting position of swinging of the polishing body, swinging stroke of the polishing body and polishing agent correction coefficient.

5. A method for deciding the working conditions under which an object of working is treated to a specified treated shape, this working condition decision method being characterized in that for all of the working conditions (standard working conditions) that are formed by combinations of all of the parameters obtained by varying the respective parameters constituting the working conditions in at least two stages, the treated shapes (standard treated shapes) obtained using these working conditions are determined, and when the desired treated shape is given, a standard treated shape that is close to the desired treated shape is selected from the predetermined standard treated shapes, and the standard working conditions corresponding to the selected standard treated shape are applied as the working conditions for treating the object of working.

6. The working condition decision method according to claim 5, which is characterized in that the standard treated shapes are classified for each similar pattern, and when the desired treated shape is given, the combination of classification patterns that gives this treated shape is first selected, and only the standard treated shapes that are included in the selected classification patterns are used as the objects of selection, or the combination of standard treated shapes that produces a treated shape that is close to the desired treated shape is used as the object of determination.

7. A working condition decision system for deciding the working conditions under which an object of working is treated to a specified treated shape, this working condition decision system being characterized in that the system has model memory means for classifying and storing as classification patterns (for each similar pattern) the treated shapes (standard treated shapes) obtained using the working conditions, for all of the working conditions (standard working conditions) that are formed by combinations of all of the parameters obtained by varying the respective parameters constituting the working conditions in at least two stages, means for inputting the desired treated shape, and working condition decision means for first selecting a classification pattern that resembles the desired treated shape from the standard treated shapes, then selecting a standard treated shape that is close to the desired treated shape from the standard treated shapes contained in the selected classification pattern, and applying the standard working conditions corresponding to the selected standard treated shape as the working conditions for treating the object of working.

8. The working condition decision system according to claim 7, which is characterized in that when the classification pattern that resembles the desired treated shape is selected, a plurality of classification patterns are selected.

9. The working condition decision system according to any one of claims 7 through 8, which is characterized in that the working is polishing in which an object of polishing is polished by causing relative motion between a polishing body and this object of polishing in a state in which a polishing agent is interposed between the polishing body and the object of polishing.

10. The working condition decision system according to claim 9, which is characterized in that the working conditions include one or more of the following:

rotational speed of the object of polishing, rotational speed of the polishing body, polishing time, polishing pressure, polishing agent flow rate, starting position of swinging of the polishing body, swinging stroke of the polishing body and polishing agent correction coefficient.

11. A working system using a working apparatus that treats an object of working by causing the relative motion of a tool and this object of working in a state in which abrasive particles are interposed between the tool and object of working, this working system being characterized in that the system has means for deciding the working conditions by the working condition decision method according to any one of claims 1 through 2, or the working condition decision system according to any one of claims 7 through 8, and means for controlling the working apparatus so as to conform to the decided working conditions.

12. A semiconductor device manufacturing method which is characterized in that this method includes a step in which the wafer polishing conditions are determined using the working condition decision system according to claim 9, and the wafer is polished in accordance with these polishing conditions.

13. A semiconductor device manufacturing method which is characterized in that this method includes a step in which the wafer polishing conditions are determined using the working condition decision system according to claim 10, and the wafer is polished in accordance with these polishing conditions.

14. A semiconductor device manufacturing method which is characterized in that this method includes a step in which the wafer polishing conditions are determined using the working condition decision system according to claim 11, and the wafer is polished in accordance with these polishing conditions.

15. A working condition decision system for deciding the working conditions under which an object of working is treated to a specified treated shape, this working condition decision system being characterized in that the system has model memory means for storing the treated shapes (standard treated shapes) obtained using the working conditions, for all of the working conditions (standard working conditions) that are formed by combinations of all of the parameters obtained by varying the respective parameters constituting the working conditions in at least two stages, means for inputting the desired treated shape, and working condition decision means for selecting a standard treated shape that is close to the desired treated shape from the standard treated shapes, and applying the standard working conditions corresponding to the selected standard treated shape as the working conditions for treating the object of working.

16. The working condition decision system according to claim 15, which is characterized in that the model memory means are devised so that these means classify and store the standard treated shapes for each similar pattern, and the working condition decision means have a function which is such that when the desired treated shape is given, the combination of classification patterns that produces this treated shape is first selected, and a selection is then performed with only the standard treated shapes contained in the selected classification patterns taken as objects of selection, or with the combination of standard treated shapes that produces a treated shape that is close to the desired treated shape taken as the object of selection.

17. A working condition decision calculator program stored on a computer readable medium for deciding the working conditions under which an object of working is treated to a specified treated shape, this working condition decision calculator program being characterized in that the program has a processing process in which the treated shapes (standard treated shapes) obtained using the working conditions are classified and stored in memory as classification patterns (for each similar pattern) for all of the working conditions (standard working conditions) that are formed by combinations of all of the parameters obtained by varying the respective parameters constituting the working conditions in at least two stages, a classification pattern that resembles the input desired treated shape is first selected from these standard treated shapes, a standard treated shape that is close to the input treated shape is then selected from the standard treated shapes contained in the selected classification pattern, and the standard working conditions that correspond to the selected standard treated shape are applied as the working conditions for treating the object of working.

18. The working condition decision calculator program according to claim 17, which is characterized in that when the classification pattern that resembles the desired treated shape is selected, a plurality of classification patterns are selected.

19. A program recording medium which records at least one of the working condition decision calculator programs according to any one of claims 17 through 18.

20. A working condition decision calculator program stored on a computer readable medium for deciding the working conditions under which an object of working is treated to a specified treated shape, this working condition decision calculator program being characterized in that the program has a processing process in which the treated shapes (standard treated shapes) obtained using the working conditions are stored in memory for all of the working conditions (standard working conditions) that are formed by combinations of all of the parameters obtained by varying the respective parameters constituting the working conditions in at least two stages, a standard treated shape that is close to the input desired treated shape is selected from these standard treated shapes, and the standard working conditions that correspond to the selected standard treated shape are applied as the working conditions for treating the object of working.

21. The working condition decision calculator program according to claim 20, which is characterized in that the standard treated shapes for the standard working conditions are classified for each similar pattern of the standard treated shapes, and the processing process has a processing function which is such that when the desired treated shape is given, the combination of classification patterns that produces this treated shape is first selected, and a selection is then performed with only the standard treated shapes contained in the selected classification patterns taken as objects of selection, or with the combination of standard treated shapes that produces a treated shape that is close to the desired treated shape taken as the object of selection.

* * * * *